(12) United States Patent
Norström et al.

(10) Patent No.: US 6,720,229 B2
(45) Date of Patent: Apr. 13, 2004

(54) INTEGRATED CIRCUIT INDUCTOR STRUCTURE AND NON-DESTRUCTIVE ETCH DEPTH MEASUREMENT

(75) Inventors: Hans Norström, Solna (SE); Carl Björmander, Sundbyberg (SE); Ted Johansson, Djursholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 157 days.

(21) Appl. No.: 09/986,394

(22) Filed: Nov. 8, 2001

(65) Prior Publication Data

US 2002/0057176 A1 May 16, 2002

(30) Foreign Application Priority Data

Nov. 9, 2000 (SE) .............................. 0004095

(51) Int. Cl.[7] .............................. H01L 21/20
(52) U.S. Cl. .................. 438/381; 257/531; 336/200
(58) Field of Search ................. 336/65, 83, 200, 336/206–208, 232; 29/602.1; 438/381, 618, 619, 622; 257/531, 528

(56) References Cited

U.S. PATENT DOCUMENTS

| | | |
|---|---|---|
| 5,384,274 A | 1/1995 | Kanehachi |
| 5,539,241 A | 7/1996 | Abidi et al. |
| 5,773,870 A | 6/1998 | Su et al. |
| 5,844,299 A * | 12/1998 | Merrill et al. .............. 257/531 |
| 5,930,637 A | 7/1999 | Chuang et al. |
| 6,025,261 A | 2/2000 | Farrar et al. |
| 6,140,197 A | 10/2000 | Chu et al. |
| 6,287,931 B1 * | 9/2001 | Chen .......................... 438/381 |
| 6,518,165 B1 * | 2/2003 | Yoon et al. ................. 438/619 |

FOREIGN PATENT DOCUMENTS

| | | |
|---|---|---|
| EP | 0915513 A1 | 12/1999 |
| EP | 1043770 A1 | 11/2000 |
| EP | 0971412 A2 | 12/2000 |
| WO | WO 000/07218 | 2/2000 |
| WO | WO 00/54312 | 9/2000 |

* cited by examiner

*Primary Examiner*—Tuyen T. Nguyen
(74) *Attorney, Agent, or Firm*—Burns, Doane, Swecker & Mathis, LLP

(57) ABSTRACT

A method for forming an electrical device structure in an integrated circuit comprises providing a substrate; forming a passivation layer thereon; forming a plurality of through holes in the passivation layer, the through holes; removing substrate material under the passivation layer by means of isotropic etching, thus forming at least a first cavity in the substrate beneath the plurality of through holes; forming a dielectric layer on top of the passivation layer to plug the through holes, thereby creating a membrane; and creating an electrical device, such as e.g. an inductor, above the membrane.

23 Claims, 7 Drawing Sheets

INTEGRATED CIRCUIT INDUCTOR STRUCTURE AND NON-DESTRUCTIVE ETCH DEPTH MEASUREMENT

TECHNICAL FIELD

The present invention generally relates to IC-technology and more specifically the invention relates to the formation of an electrical device structures such as e.g. an inductor structure, particularly a spiral inductor structure for radio frequency (RF) applications, integrated in an integrated circuit (IC), to the electrical device structure and the integrated circuit themselves, and to a method of etching and measuring etched depth non-destructively.

TECHNICAL BACKGROUND

The Problem Area and Known Solutions

Advanced silicon bipolar, CMOS or BiCMOS circuits are used today for high-speed applications in the 1–5 GHz frequency range, replacing circuits previously only possible to realize using III–V based technologies.

Inductor elements are often needed in high-frequency circuits building blocks like resonators and filters. An object common to all integrated technologies is to obtain inductors with high quality factors, so-called Q-values, and high operating frequencies (limited by the resonance frequency $f_R$, at which Q has fallen to zero).

Recent advances in silicon IC processing technology have allowed inductor layouts with higher inductance per area and lower losses because of reduction of feature sizes and multilayer metallization with thick oxide to isolate the inductor from the substrate. A typical integrated inductor for 1–2 GHz circuits has inductance values in the 1–10 nH range and will occupy an area up to 500 $\mu$m×500 $\mu$m, which make it very large and costly to integrate. There are still considerable losses because of the resistivity of the metallization, coupling to the substrate and losses in the substrate. Inductors elements in the 1–10 nH range with Q-values higher than 15 at 1–2 GHz are hard to obtain using silicon IC-technology.

Integrated inductors are usually designed as octagonal or square spirals metal stripes 1 on an oxide 2 formed above a semiconductor substrate 3 as illustrated in FIG. 1. An equivalent circuit for such inductor structure is schematically shown in FIG. 2. The Q-value can be calculated at low frequency (where the substrate parasitic capacitances yet do not dominate the performance) as Q=$\omega$L/r ($\omega$=2$\pi$f, f being the frequency; and L and r are the inductance and the resistance, respectively, of the inductor).

Because of the capacitance $C_{ox}$ of the isolation material between the metallization pattern and the substrate, and the silicon substrate's conducting properties, i.e. its capacitance $C_{si}$ and resistance $R_{si}$, see FIG. 2, the Q-value is reduced in the frequency range of interest (ranging from say a couple of hundred MHz to 10 GHz).

By using the upper conductor levels in a multilayer metallization system to design the inductor, the capacitance $C_{ox}$ is decreased because the inductor is further displaced from the substrate ground plane by a thick oxide. The Q-value of the inductor is consequently increased.

Another, more drastic, method is to selectively remove most of or all silicon under the inductor, see e.g. U.S. Pat. No. 5,539,241 (Abidi et al.); U.S. Pat. No. 5,930,637 (Chuang et al.), U.S. Pat. No. 5,773,870 (Su et al.); and U.S. Pat. No. 5,384,274 (Kanehachi et al.). The $C_{ox}$ parameter is lowered by the additional distance to the substrate created by the hole. This results in higher Q-values and higher self-resonant frequencies. The Q-value can be increased by a factor of two by such a removal in the form of a silicon etch from the backside of the substrate, giving air gaps of several hundred micrometers, but such techniques are not regarded as feasible in large scale production of silicon IC.

Solutions combining increased oxide thickness and partial substrate removal are known. In U.S. Pat. No. 5,833,299 (Merill et al.) is described a method where V or pyramidal shaped grooves are etched in the substrate, filled with oxide and planarized to form local islands with the result of a considerably increased isolation oxide thickness, compared to the rest of the circuit. On top of these islands, integrated inductors are formed.

Other methods to reduces the losses from the silicon substrate are disclosed in e.g. U.S. Pat. No. 5,742,091 (Hébert), where patterns of deep trenches filled with isolation material (already available in high-performance RF-IC process flows), are placed under the inductor structure to reduce the losses.

Improved techniques to remove silicon from substrate include formation of cavities in the substrate. In EP 0 971 412 A2 (Yoshida), a method is disclosed where large cavities (100 $\mu$m wide) are formed in the substrate, and subsequently filled with e.g. oxide, whereafter an inductor structure is formed thereon, and the material used to fill the cavity is then removed in a final step, to create an air-filled hole in the substrate.

In U.S. Pat. No. 6,025,261 (Farrar et al.), an inductor structure is described which incorporates polymer filled cavity structures etched in the passivation layer situated under the metal pattern for the inductor and the semiconducting substrate. However, the cavity structure is only formed in the passivation layer on top of the silicon substrate, and because of the limited thickness of this layer and the lower $\in_r$, compared to substrate silicon, the effectiveness of this structure is probably very limited.

In microelectromechanical technology (MEM), device structures are needed that can be used as sensors for pressure, acceleration, temperature etc. These structure can also be integrated on a chip, where detection electronics can be placed. In U.S. Pat. No. 6,012,336 (Eaton et al.) is disclosed a capacitance sensor structure which includes removing part of the silicon substrate, filling it with an insulator (such as silicon dioxide), and forming a structure on top of it, serving as the sensor.

Problems with Known Solutions

A solution is needed where silicon is removed under an integrated inductor structure. It must be compatible with conventional silicon IC processing, and add a minimum of additional process steps to the existing flow. The method must also be able to remove silicon fully or partly over areas larger than 500 $\mu$m×500 $\mu$m, since this is approximately the size of an integrated inductor used in communication equipment at 1–2 GHz of operating frequency.

Previously described concepts, referred to as prior art, include processing which is complex and complicated or not compatible with conventional IC processing or do involve an excessive number of steps.

Other known methods include filling the etched cavity with isolating material, e.g. silicon dioxide or a polymer. The dielectric constant $\in_r$ of these materials are indeed lower, i.e. better, than that of silicon. However, an empty cavity has the lowest dielectric constant (i.e. $\in_r$=1), so if no filling can be used, this will be preferred.

Yet other methods do not provide for structures including empty cavities, which are strong enough to withstand subsequent processing, i.e. formation of a multilayer metallization system, which is part of the subsequent conventional IC flow. This may be particularly relevant for larger inductor structures such as 500 μm×500 μm, and larger.

SUMMARY OF THE INVENTION

It is consequently an object of the present invention to provide a method in the fabrication of an integrated circuit, particularly an integrated circuit for radio frequency applications, for forming an electrical device structure, particularly an inductor structure, while overcoming at least some of the problems associated with the prior art.

It is a further object of the present invention to provide a structure formation method, which is capable of fabricating inductor structures, which obtain high Q-values and high resonance frequency.

It is still a further object of the invention to provide such structure formation method, which is capable of fabricating electrical device structures, including inductor structures, which are mechanically strong and durable.

It is yet a further object of the invention to provide such structure formation method, which is simple to perform, and which is compatible with conventional processing techniques.

It is in this respect a particular object of the invention to provide such method that adds a minimum of additional process steps to a conventional IC process.

These objects among others are, according to one aspect of the invention, fulfilled by a method comprising the following steps:

providing a semiconductor substrate;
forming a passivation layer above the substrate;
forming a plurality of through holes in the passivation layer;
removing semiconductor substrate material under the passivation layer by means of isotropic etching using the passivation layer provided with through holes as hardmask, thus forming a first cavity in the semiconductor substrate substantially underneath the through holes;
forming a dielectric layer on top of the passivation layer to plug the through holes, thereby creating a membrane above the cavities; and
creating an electrical device, such as e.g. an inductor, above the membrane.

Preferably, the method includes that the plurality of through holes formed in the passivation layer are dividable into a first and a second sub-group, respectively, such that adjacent through holes within a sub-group are more closely located than adjacent through holes belonging to different sub-groups; that semiconductor substrate material under the passivation layer is removed to form also a second cavity in the semiconductor substrate substantially underneath the through holes, such that the cavities are separated by a portion of semiconductor substrate material, which supports the membrane above the cavity.

Furthermore it is an object of the present invention to provide an electrical device structure, particularly an inductor structure, resulting from above said fabrication method; and an integrated circuit comprising such a structure.

According to a second aspect of the present invention there is thus provided an electrical device structure, particularly an inductor structure for radio frequency applications, comprising:

a semiconductor substrate;
a dielectric layer structure thereon;
an electrical device on top of the dielectric layer structure; and
a cavity structure in the semiconductor substrate, where the upper boundary of the cavity structure is defined by the dielectric layer structure, and where the cavity structure has a lateral extension comparable to that of the electrical device, and is arranged underneath the electrical device to decrease the electrical coupling between the electrical device and the substrate.

The cavity structure comprises at least one air-filled space; and the dielectric layer structure includes a plurality of through holes, said through holes being plugged by dielectric material.

In a preferred version, the cavity structure comprises a plurality of air-filled spaces and at least one portion of semiconductor substrate material extending to the dielectric layer structure for supporting the dielectric layer structure mechanically, where the portion of semiconductor substrate material separates at least two of the plurality of air-filled spaces.

According to a third aspect of the present invention there is provided an integrated circuit, particularly an integrated circuit for radio frequency applications, which comprises the electrical device structure according to the second aspect of the invention.

The residual silicon substrate support provides for a mechanically strong structure, where still a silicon removal area-utilization factor of more than 90% is obtained, i.e. more than 90% of the silicon substrate material beneath the inductor is removed and replaced by air, which has a very low dielectric constant. Thus, the quality factor and self-resonance frequency of the inductor are considerably improved.

Further, there is an object of the present invention to provide a method of etching and measuring etched depth non-destructively.

According to a fourth aspect of the present invention there is thus provided a method of etching and measuring etched depth non-destructively, comprising the steps of:

providing a semiconductor substrate;
forming a dielectric layer above the substrate;
forming a plurality of through holes in the dielectric layer;
removing semiconductor substrate material under the dielectric layer by means of isotropic etching using the dielectric layer provided with through holes as hardmask, thus forming a cavity in the semiconductor substrate;
providing the ratio between the etch rate of the isotropic etching in the semiconductor substrate material in a horizontal and in a vertical direction, respectively;
optically and non-destructively measuring the horizontal distance from an outermost one of the through holes to an edge of the cavity through the dielectric layer; and
estimating the etched depth, i.e. the etched distance in the vertical direction, from the provided etch ratio and the measured horizontal distance.

Further advantages and characteristics of the present invention will be disclosed in the following detailed description of embodiments.

BRIEF DESCRIPTION OF DRAWINGS

The present invention will become more fully understood from the detailed description of embodiments of the present invention given hereinbelow and the accompanying FIGS. 1–6, which are given by way of illustration only, and thus are not limitative of the invention.

FIG. 3a illustrates a starting structure, i.e. a silicon substrate upon which a passivation layer is formed; FIG. 3b illustrates the structure subsequent to etching of holes; FIG. 3c illustrates the structure subsequent to isotropic cavity etching; FIG. 3d illustrates the structure with the holes being plugged; and FIG. 3e illustrates the finished structure.

FIGS. 4 and 5 show the structure in two different enlargements subsequent to cavity etching and FIG. 6 shows the structure portion of FIG. 4 subsequent to hole plugging.

DETAILED DESCRIPTION OF PREFERRED EMBODIMENTS

In the following description, for purposes of explanation and not limitation, specific details are set fourth, such as particular processes, techniques, etc. in order to provide a thorough understanding of the present invention. However, it will be apparent to one skilled in the art that the present invention may be practiced in other embodiments that depart from these specific details. In other instances, detailed descriptions of well-known processes, methods, and techniques are omitted so as not to obscure the description of the present invention with unnecessary details.

With reference to the drawings an inventive embodiment of an IC fabrication process sequence, which includes formation of an inductor and of an empty cavity beneath the inductor, is described in detail.

The process can be fully integrated in different fabrication flows for integrated circuits, e.g. CMOS or bipolar or BiCMOS technology for RF-IC:s, with only minor modifications of the details described below.

The process follows initially a typical conventional process flow via formation of device isolation and active areas in a silicon substrate 11, formation of active devices etc., up to the point where the metallization (back-end) begins (not illustrated). The inductor structure could be located either on top of an area intended for a device (the illustrated case) or on top of an isolation area.

Figure 1:
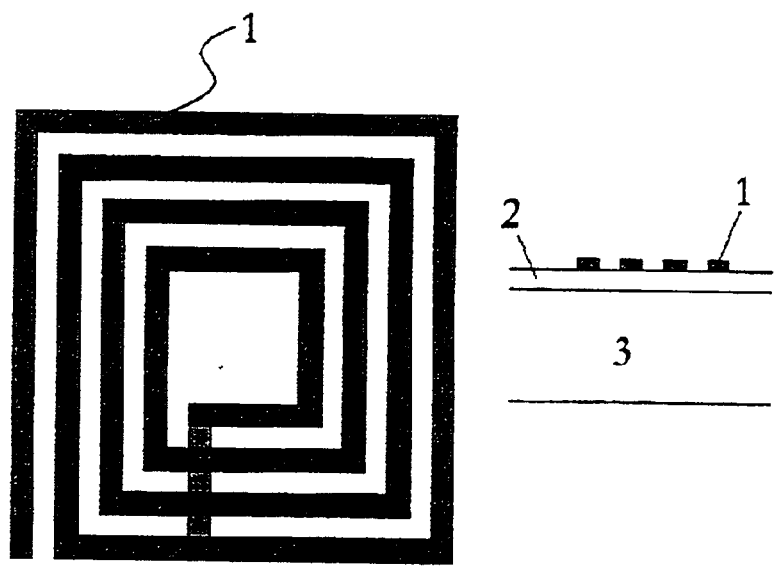
FIG. 1 is a plan top view (to the left), and a cross-sectional view (to the right), respectively, of a typical integrated inductor design comprising a spiral inductor arranged above a conducting substrate.
Figure 2:
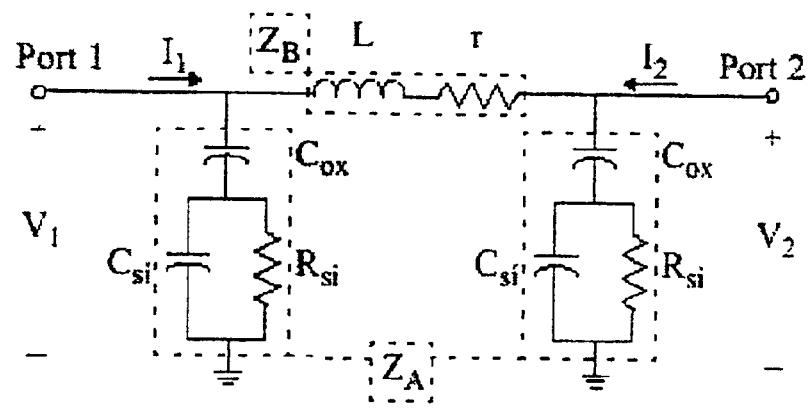
FIG. 2 is an equivalent circuit for the integrated inductor of FIG. 1.
Figure 3A:
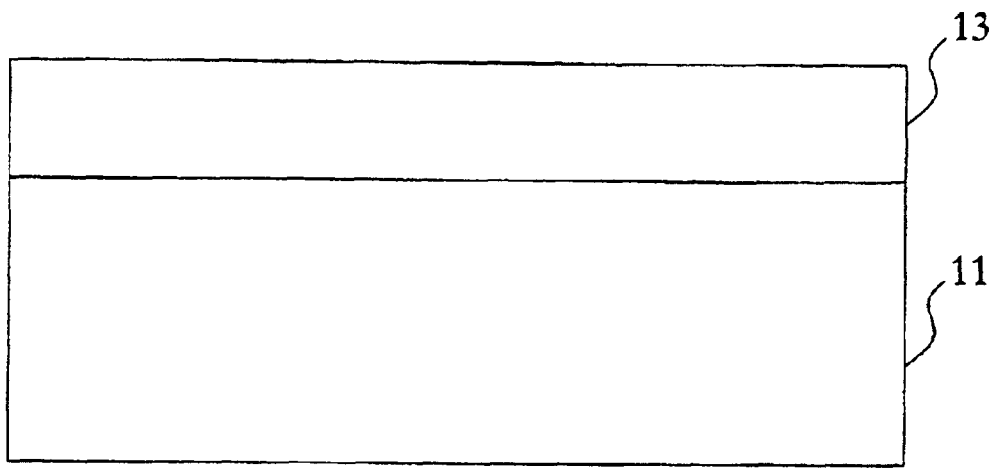
FIGS. 3a–e are highly enlarged cross-sectional views of a portion of a semiconductor structure at various steps of processing according to the present invention.

Next, a passivation layer 13, separating the metal from the active devices, consisting of ~2 $\mu$m of low-temperature oxide (PETEOS) is deposited on the silicon substrate, the result of which being illustrated in FIG. 3a. This is an integral part of a typical process sequence for the metallization, but will here also be used as a hardmask for silicon etching, since a conventional photoresist mask is less likely to withstand the silicon etch applied later in the flow. In the case the inductor is to be located on top of an isolation area a further layer of oxide (not illustrated) is existing between substrate 11 and passivation layer 13. If a planarization step is needed in the process flow, it may be performed at this stage.

Photoresist is deposited and patterned by lithography (not illustrated). The pattern consists of an array of holes or contact holes. The holes may be equally spaced in an x*y matrix configuration, but other geometries, such as patterns with circular/radial geometry may also be applied. The size of the contact holes should be kept at minimum, since that will make it easier to plug the holes at a later step. The distance between the holes is not critical, but if spaced too much apart, this will results in a non-uniform bottom surface of the cavity to be formed. This will be discussed later in the text.

Figure 3B:
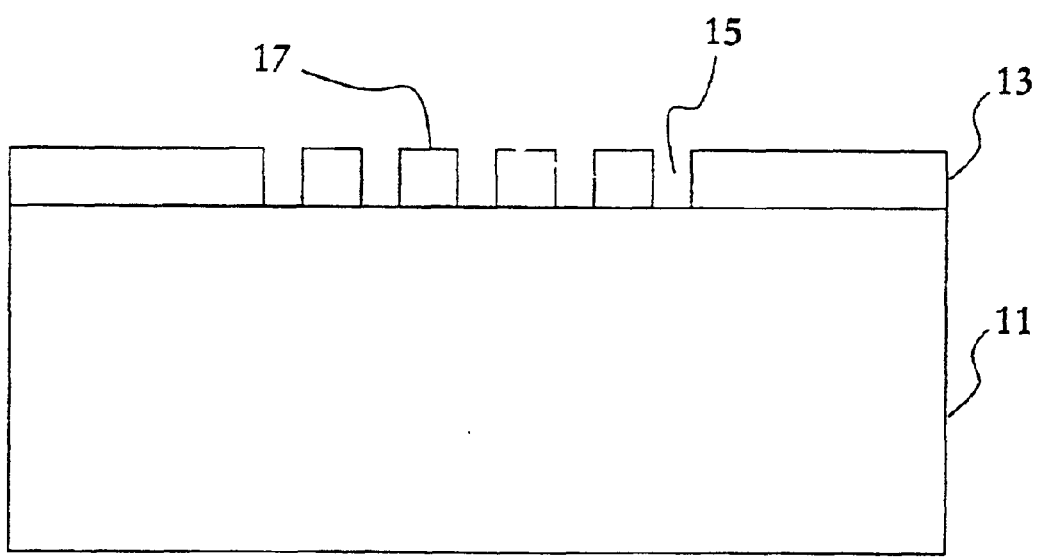

Holes 15 through oxide down to the silicon surface are dry-etched using conventional etch tools, e.g. RIE (reactive ion etching) using $CF_4/CHF_3$ chemistry. After etching, the resist is removed and the wafer is cleaned from any etch residues using standard process steps. The resulting structure is shown in FIG. 3b. In the matrix of holes a residual grid-like layer 17 of oxide is thus obtained.

Figure 3C:
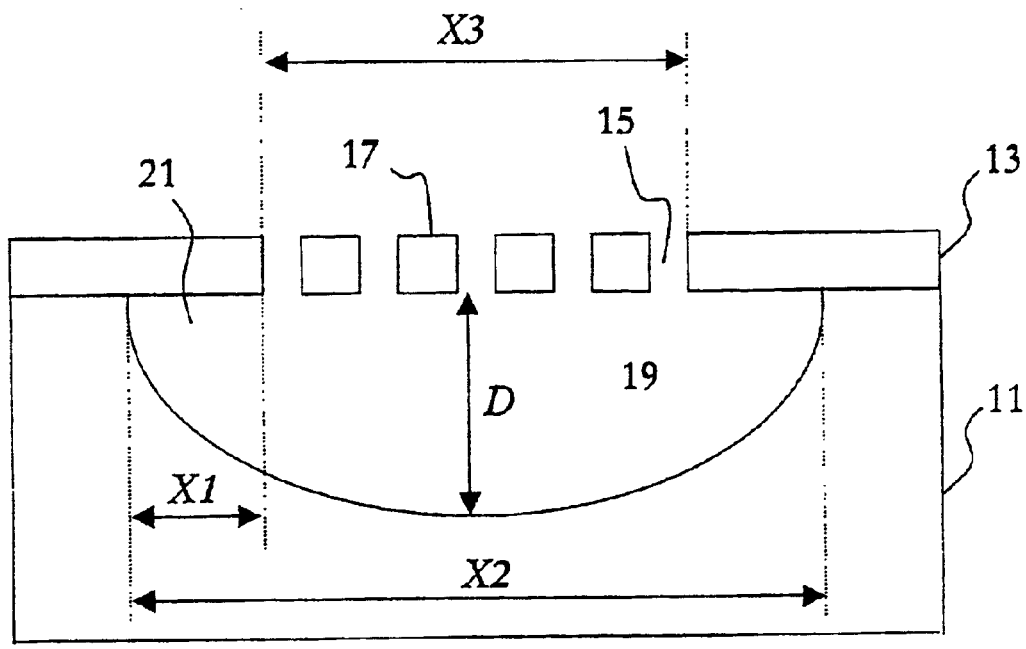

Next, a cavity 19 is formed in the substrate by isotropic silicon etch using well-known dry-etching techniques (e.g. $SF_6$ or $NF_3$ chemistry), the result of which being illustrated in FIG. 3c. The etching depth is not very critical, but the more silicon that can be removed, the larger is the improvement of the inductor structure. The isotropic etch will at the same time create a side-etch 21, in the same order as the depth, which will broaden the structure.

Figure 4:
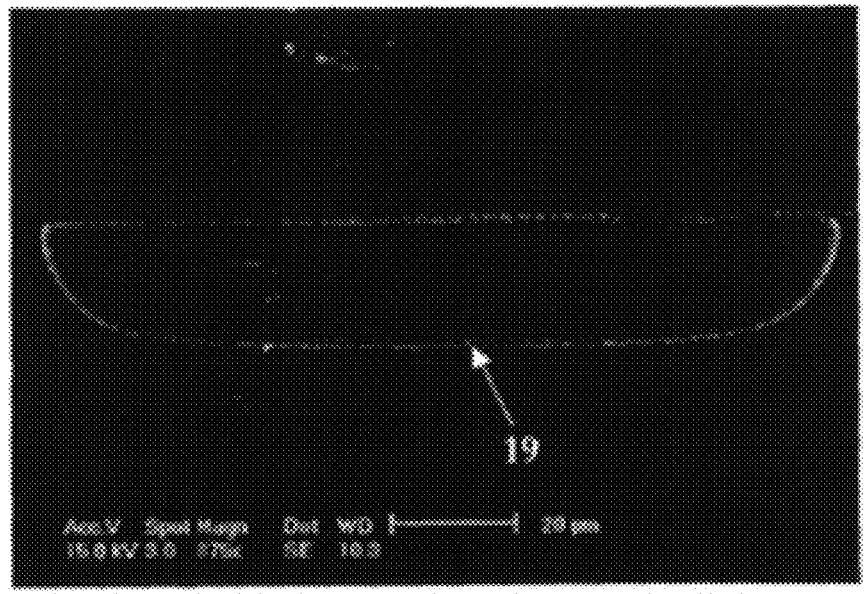
FIGS. 4–6 are SEM images of cross-sections of a semiconductor structure resulting from processing according to the present invention.

An experimental design, with a 100×100 $\mu$m hole mask (0.45 $\mu$m holes, 0.9 $\mu$m spaced, oriented as an x*y matrix), using a 20–25 $\mu$m deep silicon etch, shows that it is possible to create a cavity of approximately 130 $\mu$m×130 $\mu$m which can withstand further processing without collapsing the structure, or loss of planarity. A scanning electron microscope (SEM) photo of the cross section of the resulting structure is shown in FIG. 4.

When the distance between the holes is increased, the bottom of the cavity will become less even, and the mean effect depth of the cavity will slowly decrease. In the experimental design, the hole pitch (i.e. the sum of the hole diameter and the spaced apart distance) is around ⅕ the depth of the cavity; hence an almost smooth surface at the bottom of the cavity is obtained.

The silicon etch will also slowly etch the hardmask. After 20–25 $\mu$m of silicon etching in $SF_6$, around 1 $\mu$m of the hardmask remained. However, it is important that the erosion is limited to the top, so that the hole dimension is not widened and so the hole size can be kept under control.

Since a typical integrated inductor for 1–2 GHz circuits have inductance values in the 1–10 nH range and occupies areas up to or above 500 $\mu$m×500 $\mu$m, a plurality of 100 $\mu$m×100 $\mu$m hole matrixes spaced apart approximately 35 $\mu$m can be fabricated to cover such areas. In the case of a 500 $\mu$m×500 $\mu$m inductor sixteen hole matrixes are arranged in a 4×4 matrix, which, after isotropic etching, results in a 4×4 matrix of cavities.

Figure 5:
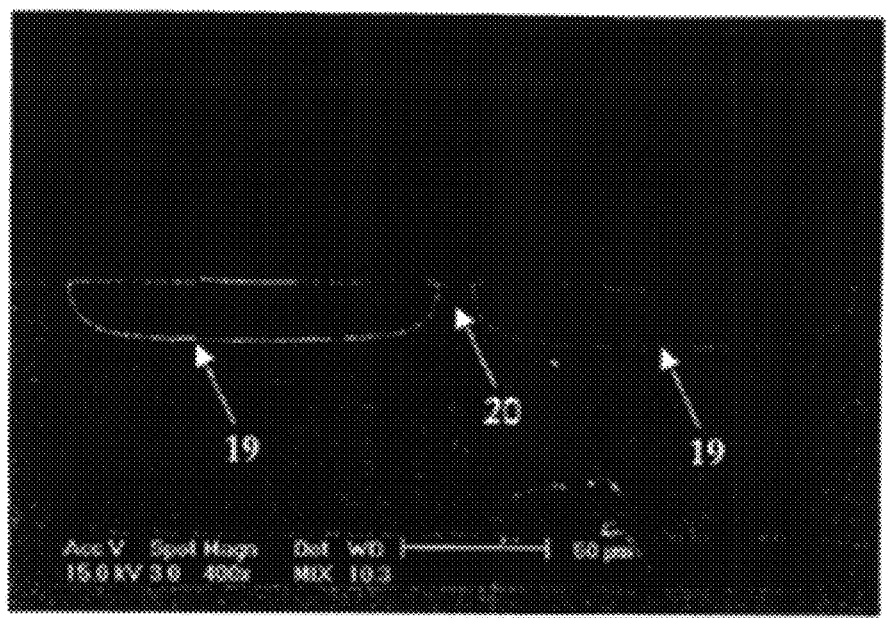

The area between the respective cavities will not be fully removed, hence a supporting string 20 of 10–15 $\mu$m wide silicon will be left between the cavities. In this way, arrays of cavities can be created, with a silicon removal area-utilization factor of more than 90%, while still a mechanically strong structure is obtained. The supporting string can also be divided into supporting pillars, to further increase the utilization factor, by properly spaced holes, see further the discussion with reference to FIGS. 7a–d. In the SEM image of FIG. 5 two cavities 19 separated by a support 20 are shown.

Figure 3D:
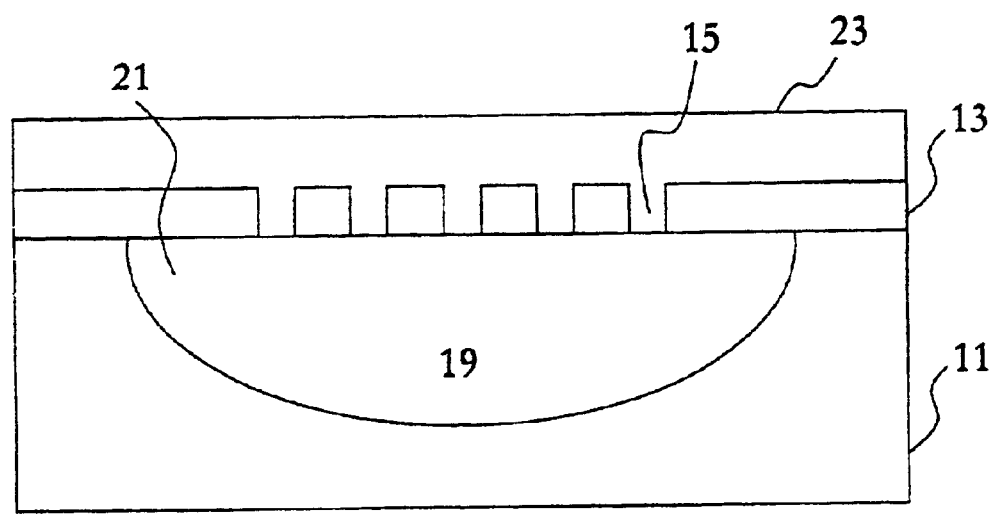

The processing continues by depositing 1.5 $\mu$m of oxide 23 on top of the structure, with the purpose to seal the holes and thus create a membrane 24 over the air-filled cavity 19, as shown in FIG. 3d. The oxide may consist of a three-layer structure. The oxide thickness is preferably selected such that the total oxide thickness, including the remaining thickness of the hardmask, is similar to the device-to-metal isolation thickness as used in a typical conventional process flow. Actually, in this case, around 1 μm is possible to use to seal the hole and create the membrane 24. Also, the holes can be made smaller, e.g. 0.25 μm instead of the used 0.45 μm, if necessary, which will further reduce the requirements on the minimum deposited oxide thickness.

Figure 6:
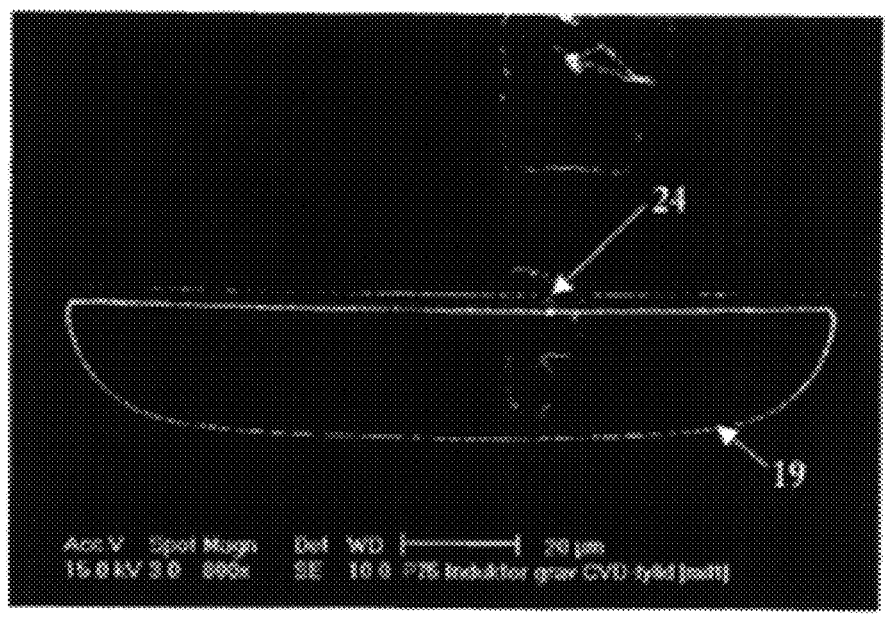

The hole size is selected small (0.45 μm diameter) so that using a reasonable oxide thickness, it is possible to completely plug the holes with oxide, without oxide being deposited into the cavity. In FIG. 6, the structure of FIG. 4 is shown after this oxide deposition step. The cavity is completely sealed with no oxide in it.

Figure 3E:
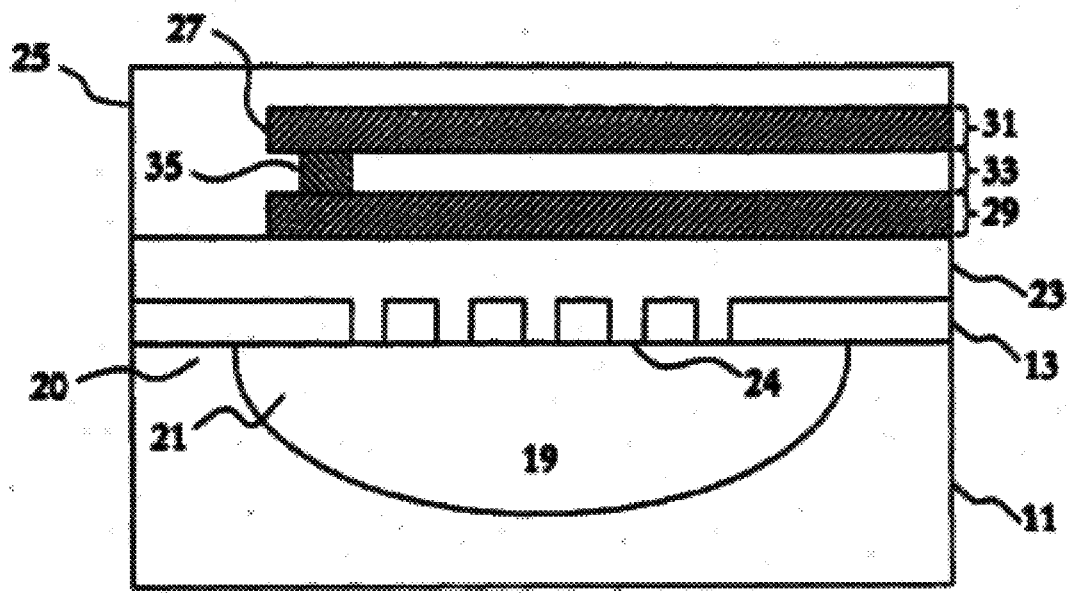

Processing then continues with formation of a multi-layer metallization arrangement 25 to create an integrated inductor 27. Note that only a portion of such integrated inductor 27 above a single one of a plurality of cavities are illustrated in FIG. 3e. It shall be appreciated that a plurality of cavities are formed beneath the complete lateral extensions of inductor 27. For the formation of inductor 27 at least two metallization layers 29, 31 and a passivation layer 33 in between, in which a via hole contact 35 is formed, are needed.

With reference now to FIGS. 7a–d some different cavity formation designs will briefly be discussed. The dots outside the cavity structures indicate merely that the structures may include an arbitrary number of cavities.

Figure 7A:
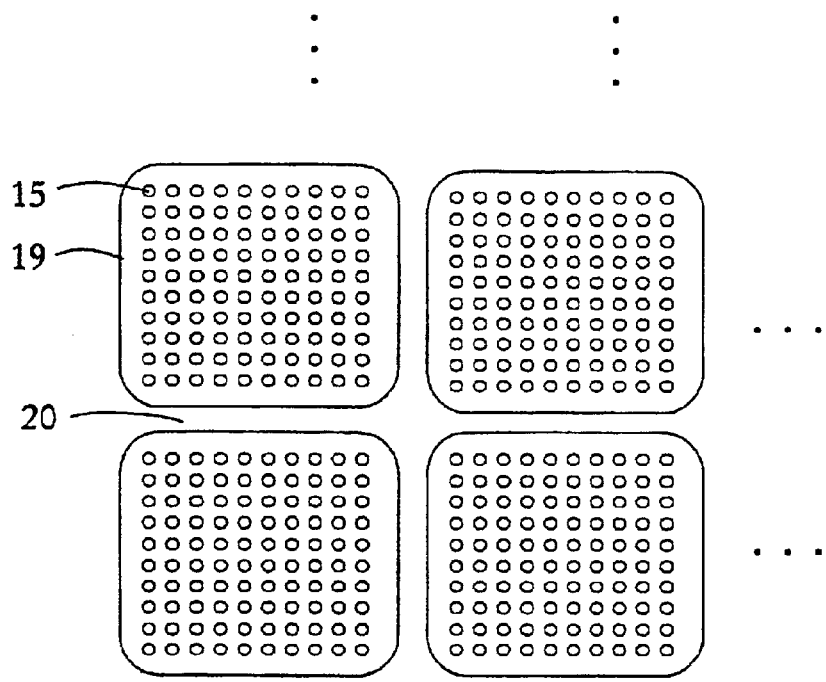
FIGS. 7a–d are schematic top plan views of different cavity formation designs according to the present invention.

In FIG. 7a is illustrated a design including a 2×2 matrix of cavities 19 beneath the area where the inductor is intended to be formed. As the areas between the respective cavities are not fully removed the membrane supporting structure 20 is in this case a strong, closely connected frame structure of silicon. In FIG. 7a also the plurality of through holes 15 are indicated.

Figure 7B:
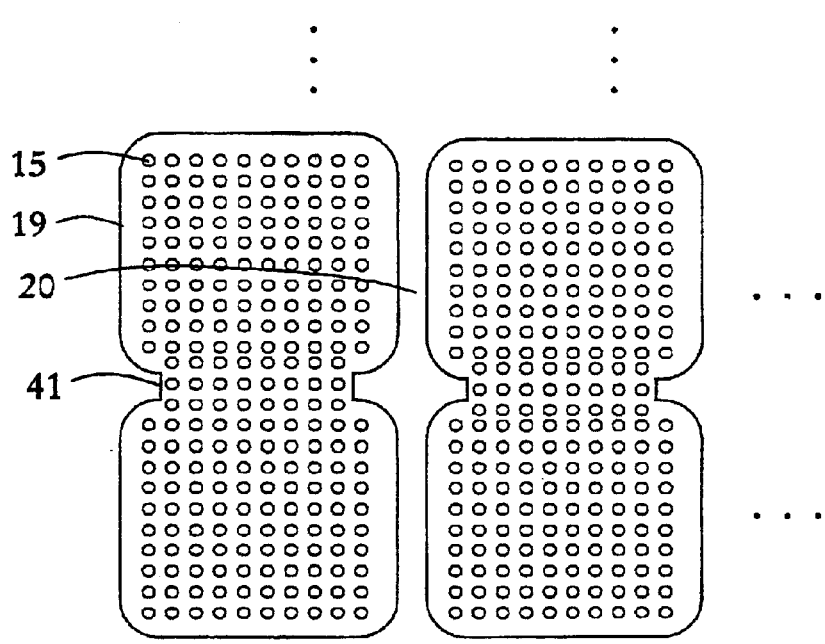

In FIG. 7b is illustrated a modified version with a plurality of smaller cavities 41 between the larger cavities 19. In such manner the silicon removal area-utilization factor is slightly larger, whereas the mechanical strength of the support structure 20 is slightly deteriorated. In the illustrated case, the larger cavities 19 and the smaller cavities 41 are overlapping and thus a reduced numeral of very large and extended cavities are obtained separated from each other by means of the supporting structure 20, which in this instance takes the form of a linearly extending support wall.

Figure 7C:
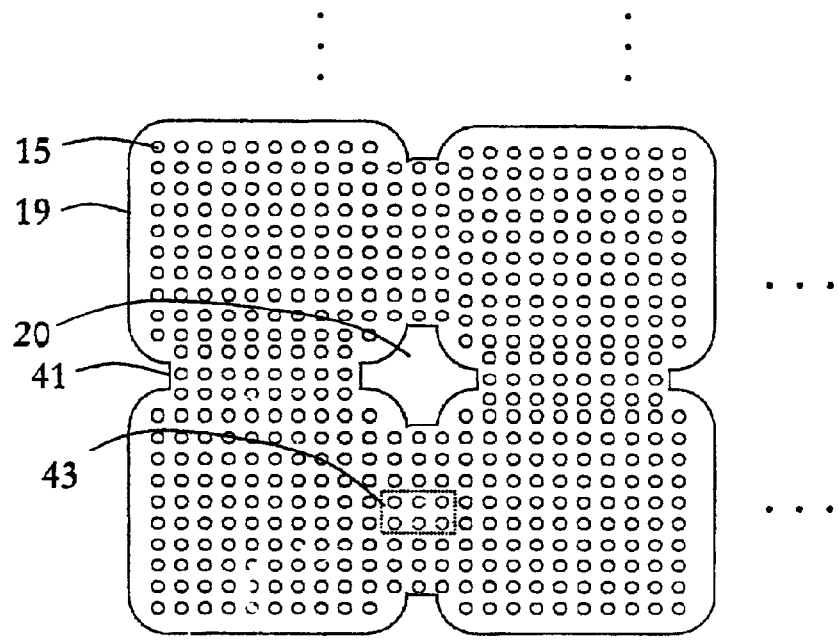

Moreover, the utilization factor can be further increased by arranging the cavities 19 and 41 such that the supporting structure is divided into a plurality of supporting pillars, of which one 20 is shown in FIG. 7c. The support structure may be strengthen by means of reducing the number of through holes for the fabrication of the smaller cavities 41. Thus, by not forming through holes in e.g. area 43 a further support may be left underneath such area.

Figure 7D:
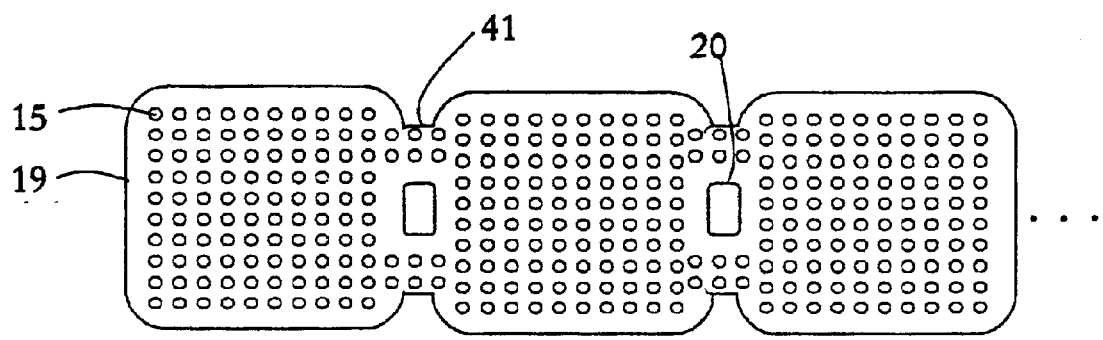

Finally, FIG. 7d illustrates a design incorporating a linear array of cavities 19 and 41. Such design may be used underneath a transmission line or other linearly extended electrical device to reduce the electrical coupling between the line/device and the substrate. In FIG. 7d a plurality of semiconductor substrate pillars 20 are left to support the structure. In other versions such pillars may be abundant.

It shall be appreciated that the present invention is usable for decreasing the electrical coupling between the substrate and virtually any kind of electrical device.

It shall further be appreciated that the cavities 41 of FIGS. 7a–d may be formed and subsequently covered in the same way as cavities 19 are formed and covered.

It shall yet further be appreciated that the embodiments of FIGS. 7a–d may be modified to achieve virtually any pattern of cavities and supports. Preferably though, a design is selected which has a good silicon removal area-utilization factor and still provides for good mechanical support for the membrane(s) formed above the cavity/support structure.

Advantages of the Present Invention

The proposed method increases the isolation gap to the substrate and hence reduces electric losses to the substrate of integrated inductor structures. The quality factor and self-resonance frequency are consequently improved.

The method can easily be implemented in an IC-manufacturing process flow, with only a few additional steps, using existing manufacturing technology.

The residual silicon substrate supports 20 (see FIGS. 3e and 5) provides for a mechanically strong structure, where still a silicon removal area-utilization factor of more than 90% is obtained, i.e. more than 90% of the silicon substrate material beneath the inductor is removed and replaced by air, which has a very low dielectric constant.

Further Aspects of the Present Invention

According a further aspect of the present invention a measurement method is provided, the method being used to measure the depth of an isotropic silicon etch non-destructively. Such distance is usually not possible to measure without a destructive test.

The depth D can be estimated by non-destructive optical inspection and measurements of the distance X1 from the outermost hole to the edge of cavity 19, see FIG. 3c. Distance X1 is easily observed through membrane 24, or by measuring the total width X2 of the cavity (where the width X3 of the matrix of holes 15 is known). If the ratio between the etch rate in horizontal and vertical direction is known (which can be calibrated for a set of etching conditions using SEM cross-section analysis), the etch depth can be directly calculated by measuring the etched width of the cavity.

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. In the fabrication of an integrated circuit, particularly an integrated circuit for radio frequency applications, a method for forming an electrical device structure comprised in said circuit, the method comprising:

providing a semiconductor substrate;

forming a first dielectric layer above said substrate;

forming a plurality of through holes in said first dielectric layer;

removing semiconductor substrate material under the first dielectric layer by means of isotropic etching using said first dielectric layer provided with through holes as hardmask, thus forming at least a first cavity in the semiconductor substrate underneath said plurality of through holes;

forming a second dielectric layer on top of said first dielectric layer to plug said plurality of through holes, thereby creating a membrane above said first cavity; and creating an electrical device above said membrane.

2. The method as claimed in claim 1 wherein said semiconductor substrate is of silicon.

3. The method as claimed in claim 1 wherein said first dielectric layer is a low-temperature oxide, particularly a PETEOS.

4. The method as claimed in claim 1 wherein said first dielectric layer is planarized.

5. The method as claimed in claim 1 wherein said plurality of through holes are formed by means of lithographic patterning followed by etching, particularly dry-etching such as RIE.

6. The method as claimed in claim 1 wherein the plurality of through holes have a diameter of less than 5 $\mu$m, preferably less than 1 $\mu$m, more preferably less than 0.5 $\mu$m, and most preferably in the range of 0.1–0.2 $\mu$m, to facilitate said subsequent plugging.

7. The method as claimed in claim 1 wherein the distance between adjacent through holes is small enough to ensure that the bottom surface of the cavity formed beneath the through holes is substantially uniform.

8. The method as claimed in claim 7 wherein the distance between adjacent through holes is less than 10 $\mu$m, preferably less than 5 $\mu$m, more preferably less than 3 $\mu$m, and most preferably around or slightly less than 1 $\mu$m.

9. The method as claimed in claim 1 wherein the semiconductor substrate material under the first dielectric layer is removed to a depth of at least 5 $\mu$m, preferably of at least 10 $\mu$m, more preferably of at least 15 $\mu$m, and most preferably of approximately 25–30 $\mu$m.

10. The method as claimed in claim 1 wherein semiconductor substrate material is removed in an area of at least 90% of the total semiconductor substrate area above which the electrical device is formed.

11. The method as claimed in claim 1 wherein the second dielectric layer is formed by depositing a three-layer structure of oxide.

12. The method as claimed in claim 1 wherein the first and second dielectric layers are deposited to such thicknesses that their remaining combined thickness coincides with a suitable device-to-metal isolation thickness.

13. The method as claimed in claim 1 wherein the electrical device is an inductor.

14. The method as claimed in claim 13 wherein the inductor is created above said membrane in a multi-layer metallization process comprising the formation of at least two metallic layers, and the formation of a passivation layer between the metallic layers, said passivation layer being provided with a via contact hole.

15. The method as claimed in claim 1 wherein the electrical device is a transmission conductor.

16. The method as claimed in claim 1 wherein:
   said through holes are dividable into a first and a second sub-group, respectively, wherein adjacent through holes within a sub-group are more closely located than adjacent through holes belonging to different sub-groups;
   semiconductor substrate material is removed under the first dielectric layer to form a second cavity in the semiconductor substrate underneath said plurality of through holes, said first and second cavities being separated by a portion of semiconductor substrate material; and
   said second dielectric layer formed on top of said first dielectric layer to plug said plurality of through holes is supported at least by said portion of semiconductor substrate material.

17. The method as claimed in claim 16 wherein the distance between adjacent through holes belonging to different sub-groups of through holes is large enough to ensure that said portion of semiconductor substrate separating the cavities formed beneath said different sub-groups is capable of supporting said membrane mechanically and hindering the same from collapsing.

18. The method as claimed in claim 17 wherein the distance between adjacent through holes belonging to different sub-groups of through holes is selected such that said portion of semiconductor substrate separating the cavities formed beneath said different sub-groups has a width of at least about 1 $\mu$m, preferably at least about 5 $\mu$m, more preferably at least about 10 $\mu$m, and most preferably between about 10 and 20 $\mu$m.

19. The method as claimed in claim 16 wherein further through holes between said first and second sub-groups of through holes are formed in said first dielectric layer; and wherein semiconductor substrate material is removed under said further through holes, thus forming at least one passage between said at least first and second cavities.

20. The method as claimed in claim 16 wherein the number of sub-groups of through holes formed and the number of cavities formed beneath a single electrical device is at least 4, preferably at least 8, more preferably at least 12, and most preferably between 10 and 20.

21. The method as claimed in claim 19 wherein the number of sub-groups of through holes formed and the number of cavities formed beneath a single electrical device is at least 4, preferably at least 8, more preferably at least 12, and most preferably between 10 and 20, and wherein said number of cavities and said at least one passage are formed such that said membrane above said number of cavities and said at least one passage is supported by semiconductor substrate material in the form of strings, walls, nets, pillars, or a framework.

22. An electrical device structure, particularly an inductor structure for radio frequency (RF) applications, integrated in an integrated circuit (IC), wherein said electrical device structure is fabricated by using the method as claimed in claim 1.

23. An integrated circuit, particularly an integrated circuit for radio frequency applications, wherein said integrated circuit comprises an electrical device structure as claimed in claim 22.

* * * * *